(12) United States Patent
Jeong et al.

(10) Patent No.: US 8,790,972 B2
(45) Date of Patent: Jul. 29, 2014

(54) METHODS OF FORMING CMOS TRANSISTORS USING TENSILE STRESS LAYERS AND HYDROGEN PLASMA TREATMENT

(75) Inventors: Yong-Kuk Jeong, Gyeonggi-do (KR); Laegu Kang, Hopewell Junction, NY (US); Kim Nam Sung, Beacon, NY (US); Dae-won Yang, Hopewell Junction, NY (US)

(73) Assignees: Samsung Electronics Co., Ltd. (KR); International Business Machines Corporation, Armonk, NY (US); GLOBALFOUNDRIES Singapore Pte. Ltd., Singapore (SG); Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/859,644

(22) Filed: Aug. 19, 2010

(65) Prior Publication Data

US 2012/0045873 A1  Feb. 23, 2012

(51) Int. Cl.
*H01L 21/336* (2006.01)
*H01L 29/78* (2006.01)
*H01L 29/66* (2006.01)
*H01L 21/8238* (2006.01)
*H01L 29/04* (2006.01)
*H01L 29/10* (2006.01)
*H01L 21/28* (2006.01)

(52) U.S. Cl.
CPC .... *H01L 21/823807* (2013.01); *H01L 29/7833* (2013.01); *H01L 29/66651* (2013.01); *H01L 29/045* (2013.01); *H01L 29/7843* (2013.01); *H01L 29/1054* (2013.01); *H01L 29/6659* (2013.01); *H01L 21/28255* (2013.01)
USPC ........................................................ 438/198

(58) Field of Classification Search
USPC ........................................................ 438/758
See application file for complete search history.

(56) References Cited

U.S. PATENT DOCUMENTS

| 7,327,001 | B1 * | 2/2008 | Singhal et al. ............... 257/377 |
| 8,138,791 | B1 * | 3/2012 | Ratnakumar et al. ........... 326/45 |
| 2006/0284255 | A1 * | 12/2006 | Shin et al. ..................... 257/351 |
| 2007/0298549 | A1 * | 12/2007 | Jurczak et al. ................ 438/149 |
| 2008/0258175 | A1 * | 10/2008 | Peidous et al. ............... 257/190 |
| 2008/0261408 | A1 * | 10/2008 | Waite et al. ................... 438/758 |
| 2009/0289280 | A1 * | 11/2009 | Zhang et al. .................. 257/190 |
| 2011/0223756 | A1 * | 9/2011 | Schaeffer et al. ............. 438/591 |

FOREIGN PATENT DOCUMENTS

| JP | 2007-005627 |  | 1/2007 |
| KR | 100699152 | B1 | 3/2007 |
| KR | 100807597 | B1 | 2/2008 |

* cited by examiner

*Primary Examiner* — Charles Garber
*Assistant Examiner* — Andre' C Stevenson
(74) *Attorney, Agent, or Firm* — Myers Bigel Sibley & Sajovec, P.A.

(57) ABSTRACT

Methods of forming integrated circuit devices include forming a PMOS transistor having a SiGe channel region therein and then exposing at least a portion of the PMOS transistor to a hydrogen plasma. A tensile stress layer may be formed on the PMOS transistor. The exposing step may include exposing source and drain regions of the PMOS transistor to the hydrogen plasma.

17 Claims, 10 Drawing Sheets

A discrete device such as a metal-oxide semiconductor (MOS) transistor is widely employed as a switching device of a semiconductor device. Accordingly, fabrication of high performance MOS transistors is required in order to improve characteristics of the semiconductor devices. In order to achieve fabrication of high performance MOS transistors, research into ways of applying a physical stress to the channel region to improve the mobility of carriers is underway.

METHODS OF FORMING CMOS TRANSISTORS USING TENSILE STRESS LAYERS AND HYDROGEN PLASMA TREATMENT

FIELD OF THE INVENTION

The present invention relates to integrated circuit fabrication methods and, more particularly, to methods of forming integrated circuit devices having CMOS transistors therein.

BACKGROUND

In general, the mobility of holes can be improved by applying a compressive stress to a transistor channel region in a case of a PMOS transistor, and the mobility of electrons can be improved by applying tensile stress to a transistor channel region in a case of an NMOS transistor. Accordingly, in producing complementary sets of metal-oxide-semiconductor (CMOS) field effect transistors, a compressive stress film and a tensile stress film are independently formed in PMOS and NMOS transistors, respectively. In such a case, separate masks for shielding each transistor region are required, and the fabrication processes may become complicated. To simplify the fabrication process without using separate masks, a tensile stress film may be formed on the PMOS transistor. However, the characteristics of a PMOS transistor including a SiGe channel region, specifically, on-current characteristics, may degrade.

SUMMARY

Methods of forming integrated circuit devices according to some embodiments of the present invention include forming a PMOS transistor having a SiGe channel region therein and then exposing at least a portion of the PMOS transistor to a hydrogen plasma. A tensile stress layer may be formed on the PMOS transistor. In particular, the exposing may include directly or indirectly exposing source and drain regions of the PMOS transistor to the hydrogen plasma.

According to still further embodiments of the invention, the step of forming a PMOS transistor may include forming a PMOS transistor having a SiGe channel region therein and forming an NMOS transistor having a silicon channel region therein, in a semiconductor substrate. For example, the PMOS transistor may be formed in an N-type well region within the substrate and the NMOS transistor may be formed in a P-type well region within the substrate. The exposing step may include directly or indirectly exposing source and drain regions of the PMOS transistor and source and drain regions of the NMOS transistor to the hydrogen plasma. The step of forming the tensile stress layer, which may follow the exposing step, may include forming a silicon nitride layer having a net tensile stress therein on the PMOS transistor. According to additional embodiments of the invention, the exposing step may be preceded by a step of depositing a tensile stress liner on the PMOS transistor. This tensile stress liner may also be exposed directly to the hydrogen plasma during the exposing step, with the underlying PMOS transistor being indirectly exposed to the hydrogen plasma in response to the migration of hydrogen through the tensile stress liner. This tensile stress liner may be thinner than the tensile stress layer.

According to still further embodiments of the invention, a method of forming an integrated circuit device includes forming a plurality of NMOS and PMOS transistors adjacent a surface of a semiconductor substrate. The forming of the PMOS transistors may include selectively etching the surface of the semiconductor substrate to define a recess therein and then epitaxially growing a silicon germanium region in the recess. Gate electrodes of the PMOS transistors may then be formed on the silicon germanium region. A tensile stress liner having a first thickness is formed on the NMOS and PMOS transistors. This tensile stress liner is deposited under conditions that cause it to impart a net tensile stress on channel regions of the NMOS and PMOS transistors. This tensile stress liner is also exposed to a hydrogen plasma. An electrically insulating tensile stress layer, which has a second thickness greater than the first thickness, is formed on the tensile stress liner. The electrically insulating tensile stress layer is configured to impart a net tensile stress on the tensile stress liner.

BRIEF DESCRIPTION OF THE DRAWINGS

The above and other objects of the present invention will be described in or be apparent from the following description of the preferred embodiments.

According to an aspect of the present invention, there is provided a method of fabricating a semiconductor device, the method including providing a substrate, forming a PMOS transistor including a SiGe channel region in the substrate, performing hydrogen plasma treatment on the substrate having the PMOS transistor, and forming a tensile stress film on the hydrogen plasma treated substrate.

BRIEF DESCRIPTION OF THE DRAWINGS

Figure 10:
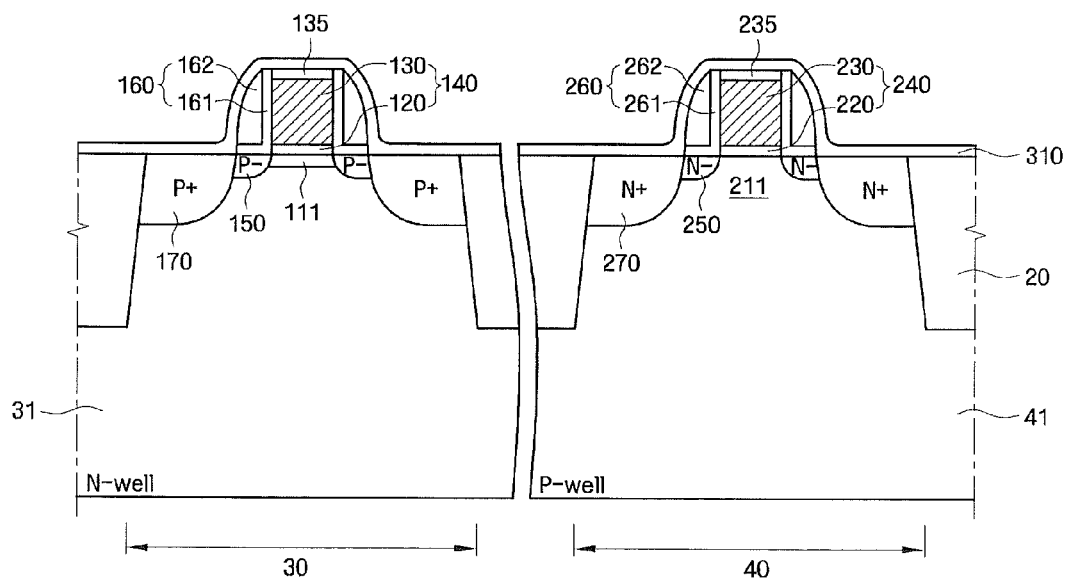
Figure 11:
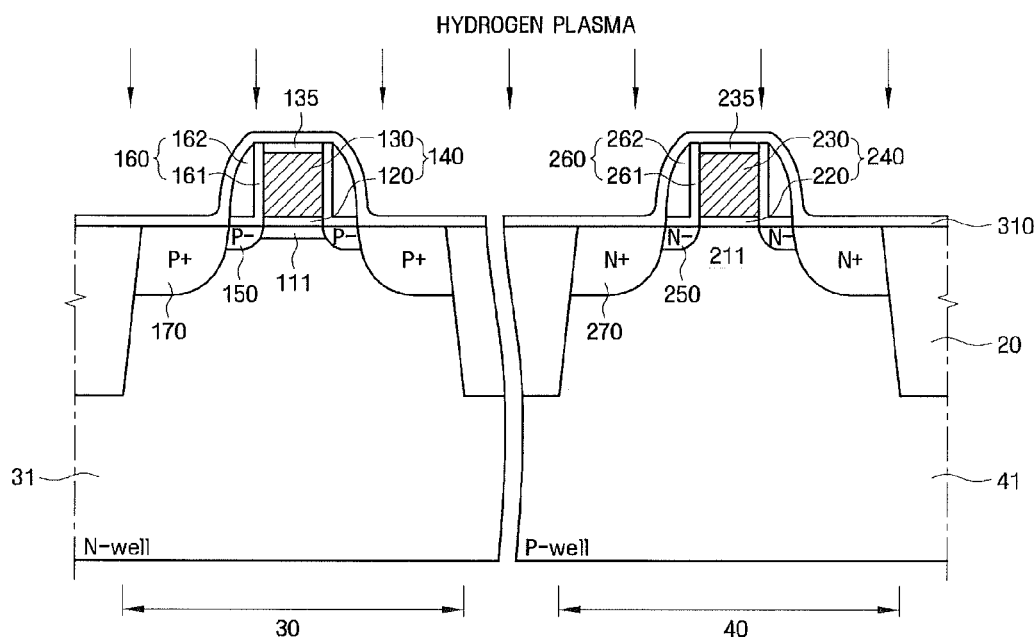
Figure 12:
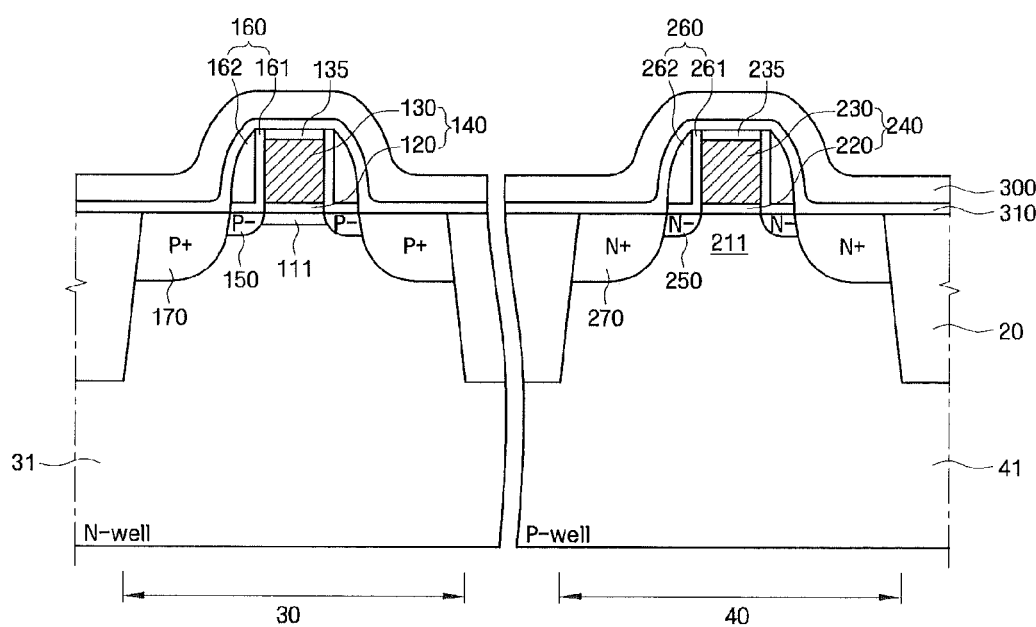
Figure 13A:
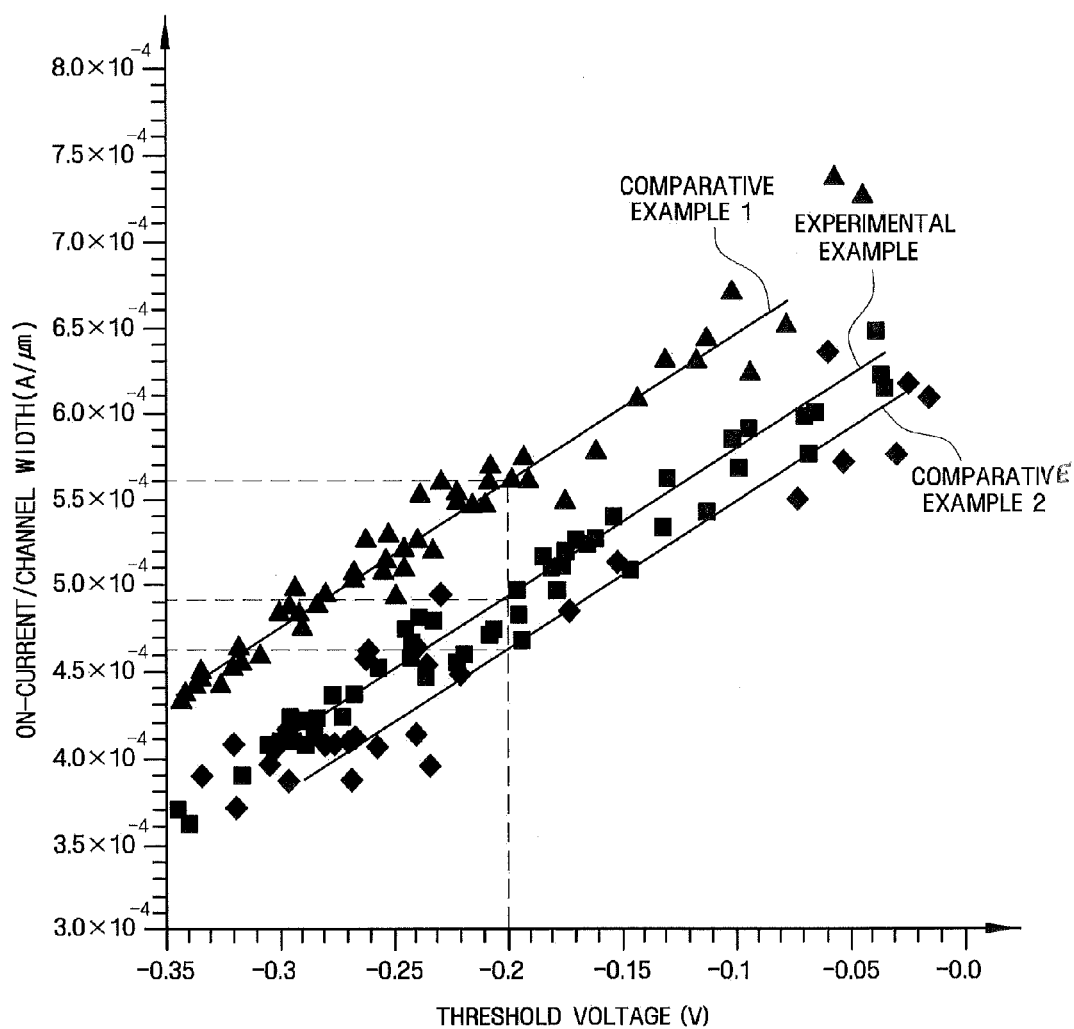
Figure 13B:
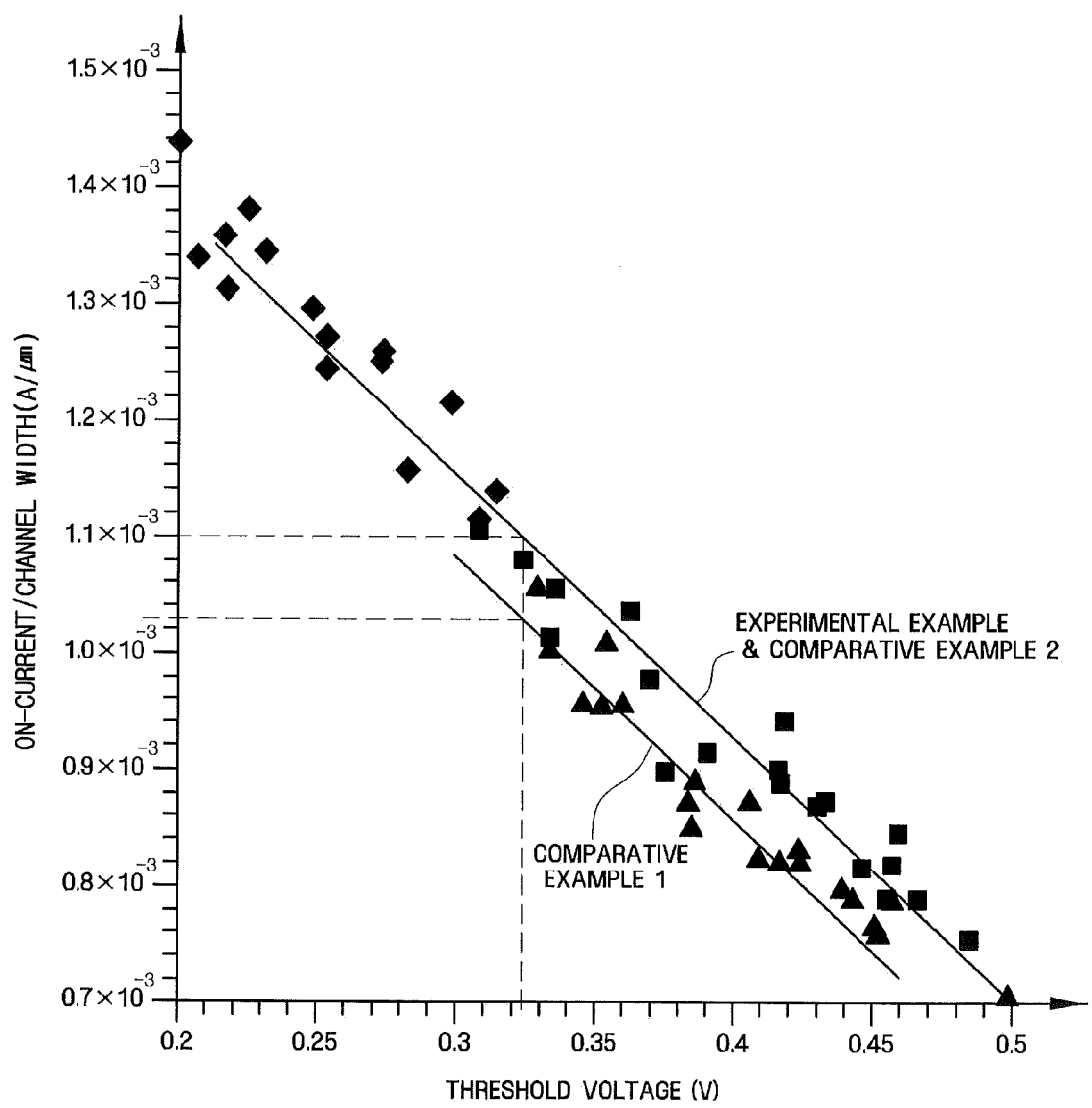
Figure 14:
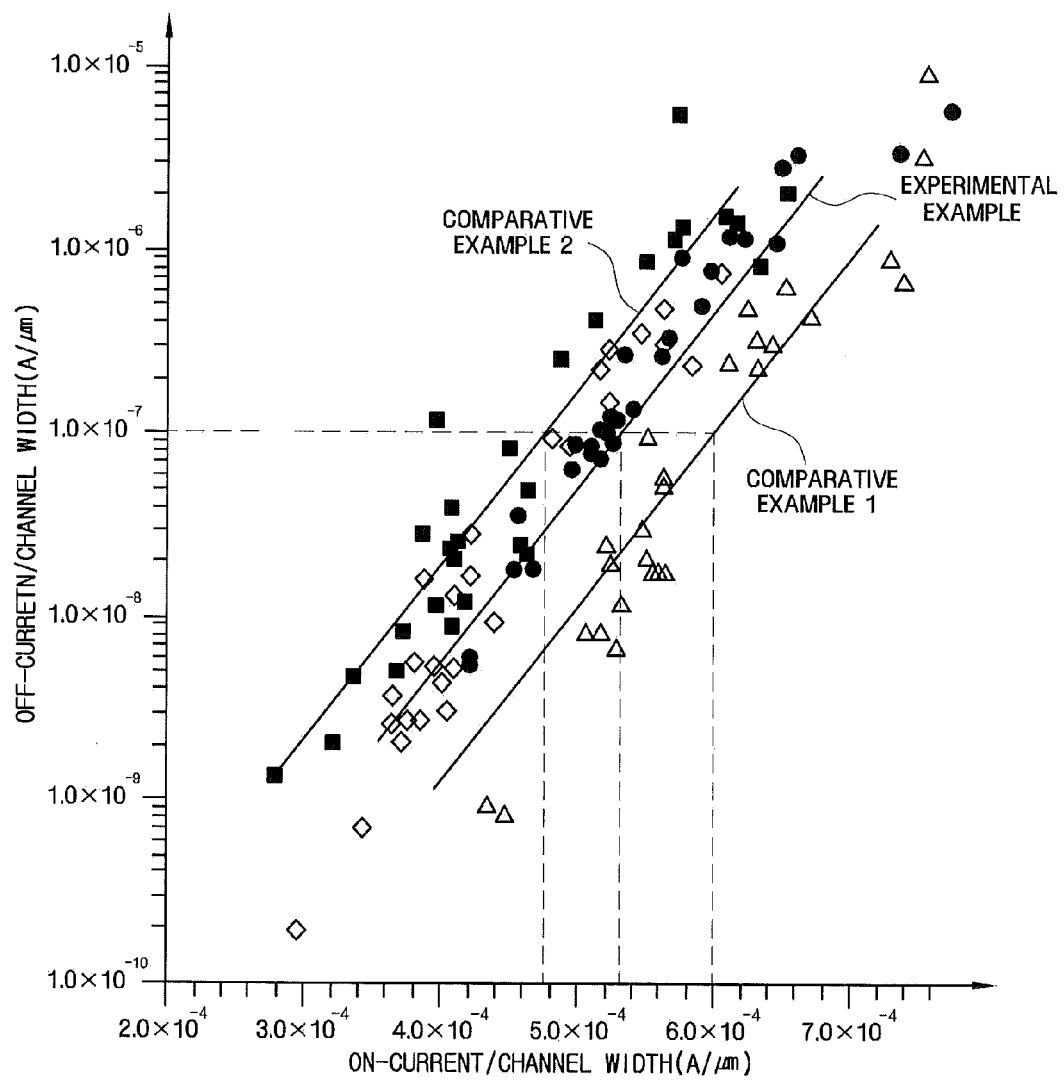

The above and other features and advantages of the present invention will become more apparent by describing in detail preferred embodiments thereof with reference to the attached drawings in which:

FIGS. 1 through 9 are cross-sectional views illustrating processing steps for a method of fabricating a semiconductor device according to a first embodiment of the present invention;

FIGS. 10 through 12 are cross-sectional views illustrating processing steps for a method of fabricating a semiconductor device according to a second embodiment of the present invention;

FIGS. 13A and 13B graphically illustrate results obtained by measuring on-current values relative threshold voltage levels of PMOS and NMOS transistors of semiconductor devices fabricated in Example and Comparative Examples 1 and 2; and FIG. 14 graphically illustrates a result obtained by measuring off-current values relative to on-current values of PMOS and NMOS transistors of semiconductor devices fabricated in Example and Comparative Examples 1 and 2.

DETAILED DESCRIPTION OF THE EMBODIMENTS

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals designate like elements throughout the specification.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of fabricating a semiconductor device according to a first embodiment of the present invention will be described with reference to FIGS. 1 through 9. FIGS. 1 through 9 are cross-sectional views illustrating processing steps for a method of fabricating a semiconductor device according to a first embodiment of the present invention.

Figure 1:
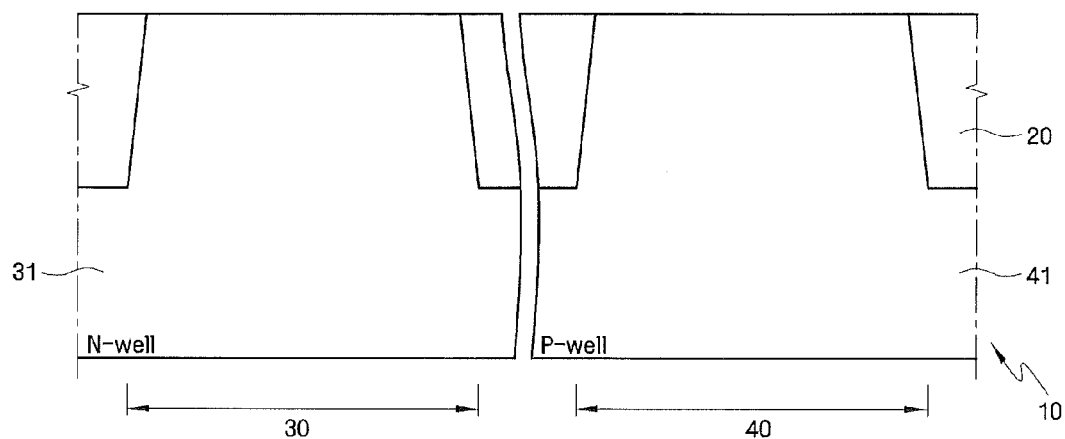

First, referring to FIG. 1, a substrate 10 including first and second active areas 30 and 40 is provided.

In detail, isolation regions 20 can be formed in a substrate 10 to define the first and second active areas 30 and 40. The substrate 10 may be a Si substrate, a SOI (Silicon On Insulator) substrate, a GaAs substrate, a SiGe substrate, a ceramic substrate, a quartz substrate, a glass substrate for display, a flexible plastic substrate, such as polyimide, PET (polyethylene terephthalate), PEN (polyethylene naphthalate), PMMA (polymethyl methacrylate), PC (polycarbonate), PES (polyether sulfone), or polyester, and so on. The isolation regions 20 may be FOX (Field OXide) formed using LOCOS (LOCal Oxidation of Silicon) or STI (Shallow Trench Isolation) regions In forming the isolation regions 20, a position of the substrate 10 may be adjusted so as to make crystallographic orientation of channel regions of the PMOS and NMOS transistors to be parallel to a <100> crystallographic orientation. In other words, when the substrate 10 has a <110> crystallographic orientation, the position of the substrate 10 can be adjusted by rotating the substrate 10 by 45° or 135°.

If the substrate 10 has a <100> crystallographic orientation, rotation of the substrate 10 may not be necessarily performed. If the crystallographic orientation of a channel region is parallel to the <100> crystallographic orientation, the current drive strength of the PMOS transistor is improved by about 10-20%. Conversely, even if the crystallographic orientation of a channel region is parallel to the <100> crystallographic orientation, the NMOS transistor demonstrates little change in its operating characteristic but the current drive strength of the NMOS transistor can be improved by tensile stress to be applied later.

Next, an N well 31 is formed by implanting N-type impurities into the first active region 30, and P well 41 is formed by implanting P-type impurities into the second active region 40.

Figure 2:
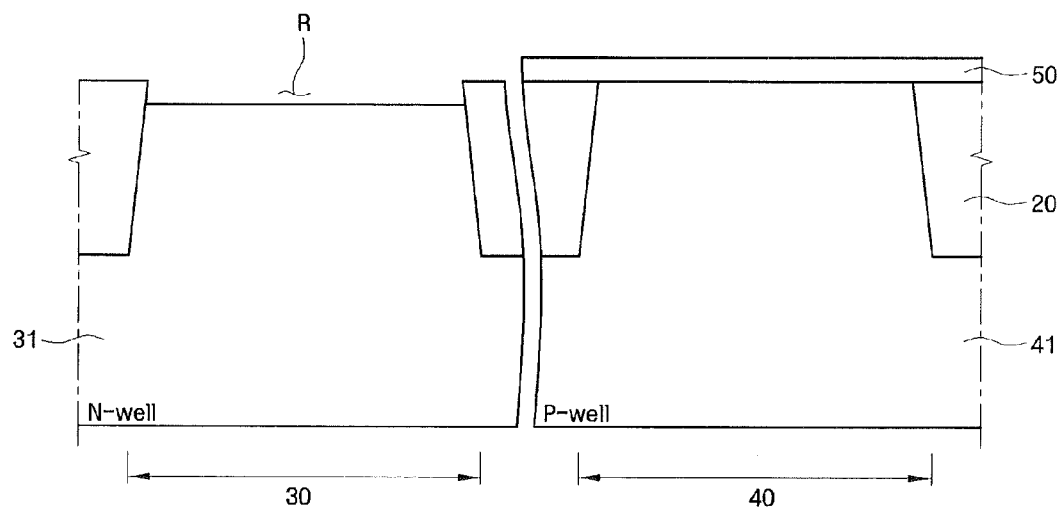
Figure 3:
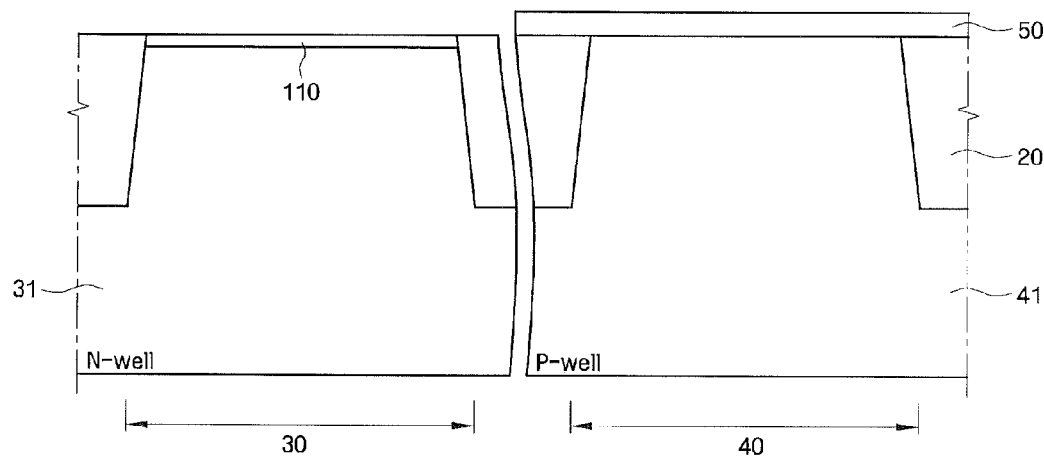

Referring to FIGS. 2 and 3, a SiGe epitaxial layer 110 used to as a channel region is selectively formed in the first active region 30 of the substrate 10.

In detail, referring to FIG. 2, an epitaxial blocking film 50 is formed in the second active region 40 of the substrate 10. The epitaxial blocking film 50 serves to prevent an epitaxial layer from being formed at a portion of the second active region 40 by blocking the second active region 40 of the substrate 10 during selective epitaxy growth. For example, the epitaxial blocking film 50 may be formed such that a silicon oxide film is formed on the substrate 10 at low temperature using an ALD (Atomic Layer Deposition) technique, and the silicon oxide film formed on the first active region 30 is removed using a photolithography technique.

Next, a recess R is formed on the substrate 10 of the first active region 30. The recess R may be formed to a depth of about 100 to 350 Å from a top surface of the substrate 10.

Referring to FIG. 3, the SiGe epitaxial layer 110 is formed in the recess R of the first active region 30 using SiGe epitaxy. The selective epitaxy growth process for forming the SiGe epitaxial layer 110 may be performed under the following process conditions. That is to say, a process temperature was set to be in a range between about 500° C. and about 900° C. and a process pressure was set to be in a range between about 1 Torr and about 500 Torr. In addition, conditions of the selective epitaxy growth can be appropriately adjusted within the scope of the present invention. Non-limiting examples of the usable silicon source gas include $SiH_4$, $SiH_2Cl_2$, $SiHCl_3$, $SiCl_4$, $SiH_xCl_y$ (x+y=4), $Si(OC_4H_9)_4$, $Si(OCH_3)_4$, and $Si(OC_2H_5)_4$, and non-limiting examples of the usable Ge source gas include $GeH_4$, $GeCl_4$, and $GeH_xCl_y$ (x+y=4).

In this embodiment, the SiGe epitaxial layer 110 is formed only in the first active region 30, and the SiGe channel region is used for a PMOS transistor and the Si channel region is used for an NMOS transistor. SiGe has a conduction band offset of about 30 mV lower than Si, while having a valence band offset of about 230 mV lower than Si. Therefore, the SiGe channel region is used for the PMOS transistor, thereby lowering a threshold voltage and improving the mobility of carriers. In contrast, when the Si channel region is used for the NMOS transistor, diffusion of N-type impurities can be more effectively suppressed than in a case when the SiGe channel region is used for the NMOS transistor, and a deterioration phenomenon of short channels can be reduced. In addition, even if the SiGe channel region is used in the NMOS transistor, the mobility of carriers may deteriorate while barely affecting the threshold voltage. Therefore, the Si channel region is preferably used for the NMOS transistor.

Referring to FIG. 2, the recess R is formed on the substrate 10 of the first active region 30 and the SiGe epitaxial layer 110 is formed in the recess. On the other hand, the SiGe epitaxial layer 110 may be formed to have a top surface higher than the substrate 10, instead of forming the recess R on the substrate 10.

Figure 4:
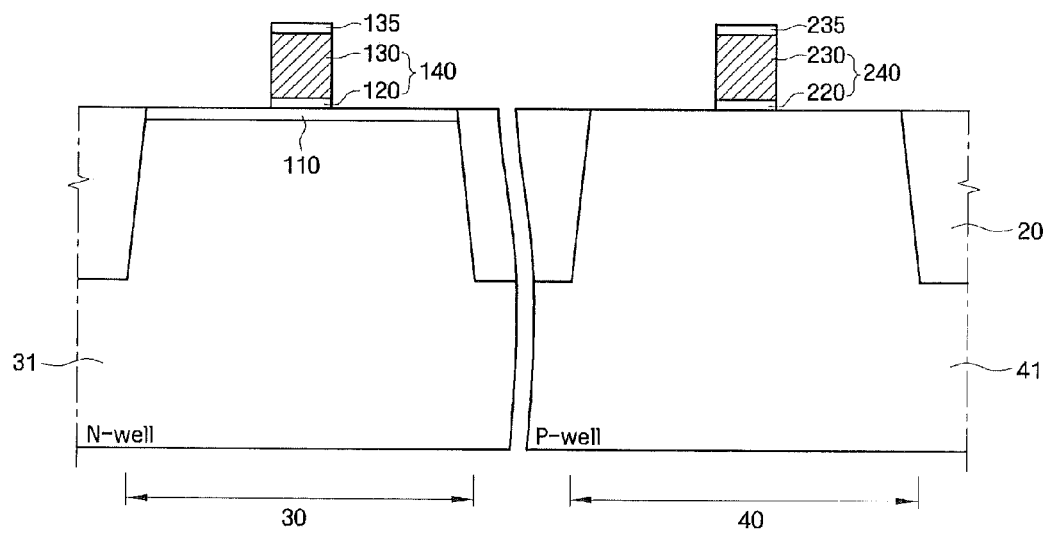

Referring to FIG. 4, first and second gate stacks 140 and 240 are formed on the first and second active regions 30 and 40, respectively.

In detail, the epitaxial blocking film 50 formed on the second active region 40 is removed, and an insulating film and a conductive film are sequentially laminated on the first and second active regions 30 and 40 and patterned to form first and second gate insulating films 120 and 220, and first and second gate electrodes 130 and 230. The first and second gate insulating films 120 and 220 may include, for example, $SiO_2$, SiON, $Si_3N_4$, $Ge_xO_yN_z$, $Ge_xSi_yO_z$, a high-K material, combinations thereof, and/or a laminated film formed of two or more of these materials.

Examples of the high-K material include $HfO_2$, $ZrO_2$, $Al_2O_3$, $Ta_2O_5$, HfSiON, hafnium silicate, zirconium silicate, and a film made of combinations thereof. In addition, the first and second gate electrodes 130 and 230 may be formed of poly-Si, poly-SiGe, doped poly-Si, a metal selected from the group consisting of Ta, TaN, TaSiN, TiN, Mo, Ru, Ni, and NiSi, and/or a laminated film formed of two or more of these materials.

In addition, first and second capping layers 135 and 235 are selectively formed on the first and second gate electrodes 130 and 230. The first and second capping layers 135 and 235 may be formed using SiN or SiON.

Figure 5A:
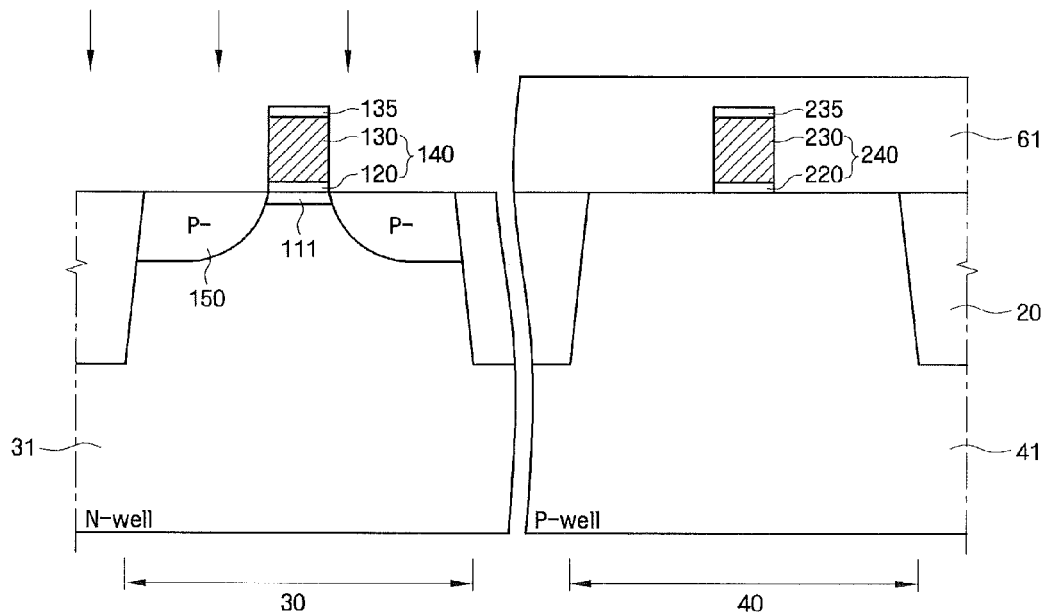
Figure 5B:
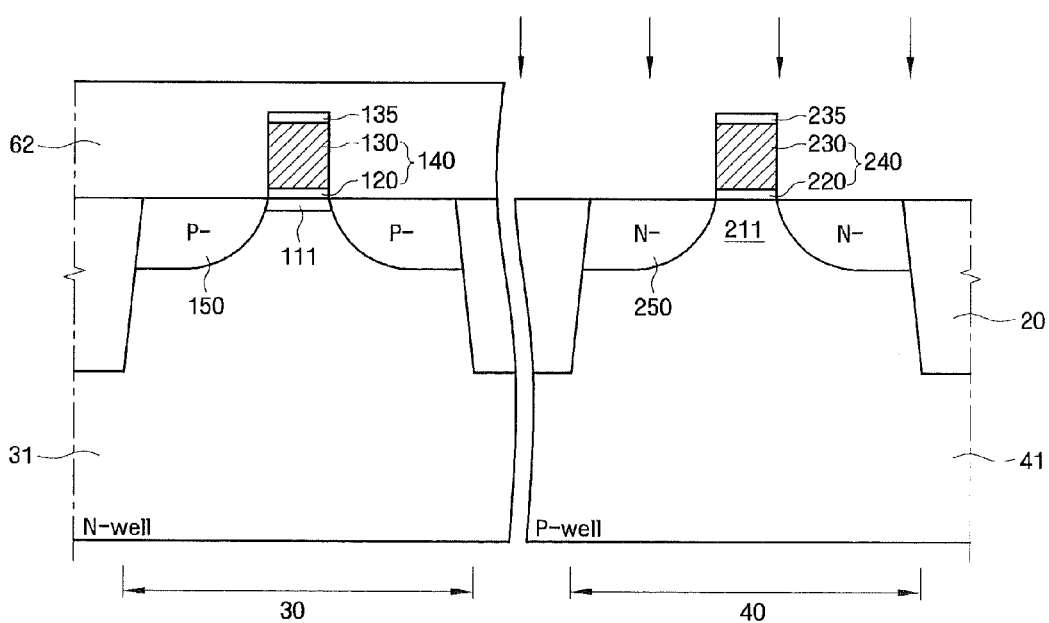

Referring to FIGS. 5A and 5B, P-type and N-type lightly doped impurity regions 150 and 250 are formed.

In detail, as shown in FIG. 5A, the second active region 40 is blocked using a mask 61, and P-type impurity, e.g., boron (B), is implanted using the first gate stack 140 and the first capping layer 135 of the PMOS transistor as an ion implantation mask to form a P-type lightly doped impurity region 150 in the first active region 30. A region between P-type lightly doped impurity regions 150 corresponds to a channel region 111 of the PMOS transistor. Next, as shown in FIG. 5B, the first active region 30 is blocked using a mask 62, and N-type impurity, e.g., arsenic (As), is implanted using the second gate stack 240 and the second capping layer 235 of the NMOS transistor as an ion implantation mask to form an N-type lightly doped impurity region 250 in the second active region 40. A region between N-type lightly doped impurity regions 250 corresponds to a channel region 211 of the NMOS transistor.

Figure 6:
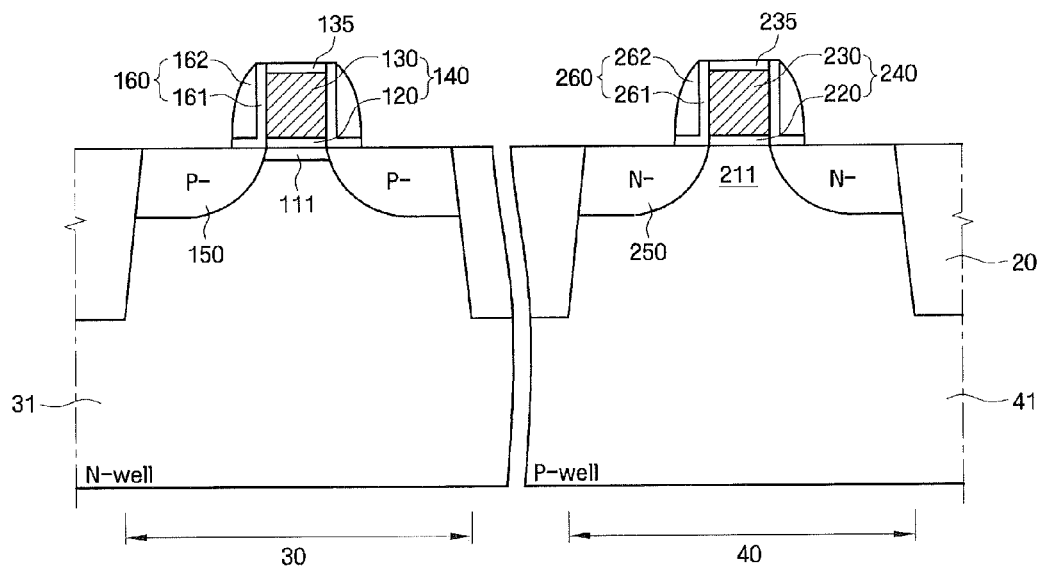

Next, referring to FIG. 6, first and second spacers 160 and 260 are formed.

In detail, an oxide film for first and second spacers, and a nitride film for first and second spacers are sequentially formed on the entire surface of the substrate 10 having the first and second gate stacks 140 and 240 and the first and second capping layers 135 and 235. First and second spacers 160 and 260 are formed on sidewalls of the first and second gate stacks 140 and 240 and the first and second capping layers 135 and 235 using a blanket etching process, such as an etch-back process. Here, the oxide films 161 and 261 serve to eliminate damages occurring to the sidewalls of the first and second gate electrodes 130 and 230 when patterning the first and second gate electrodes 130 and 230, and to prevent impurities in the first and second gate electrodes 130 and 230 from being diffused outward. In addition, the oxide films 161 and 261 serve as buffers between each of the first and second gate electrodes 130 and 230 and each of the nitride films 162 and 262.

Figure 7A:
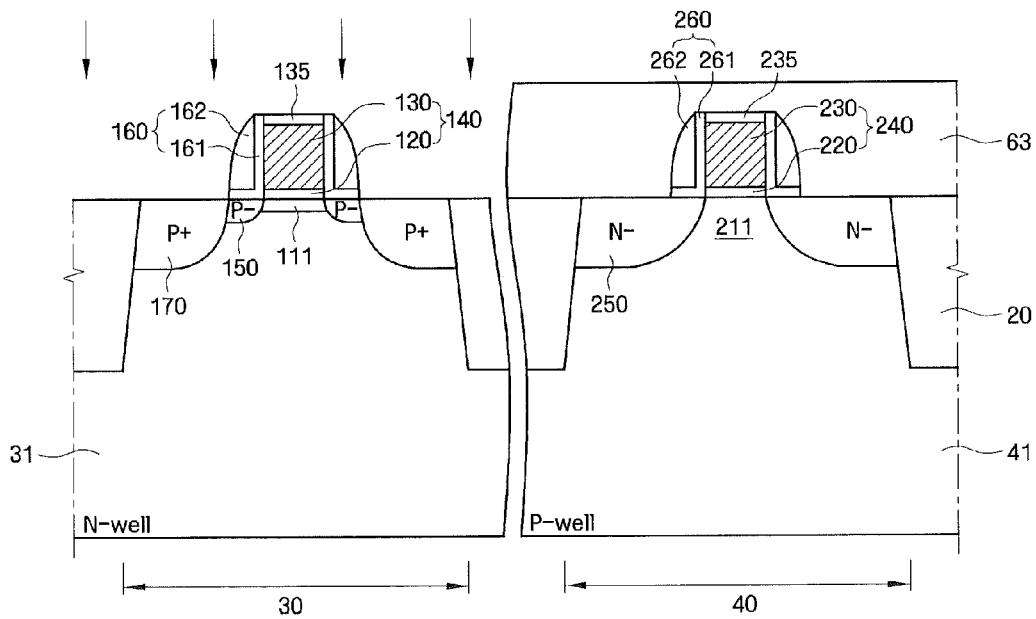
Figure 7B:
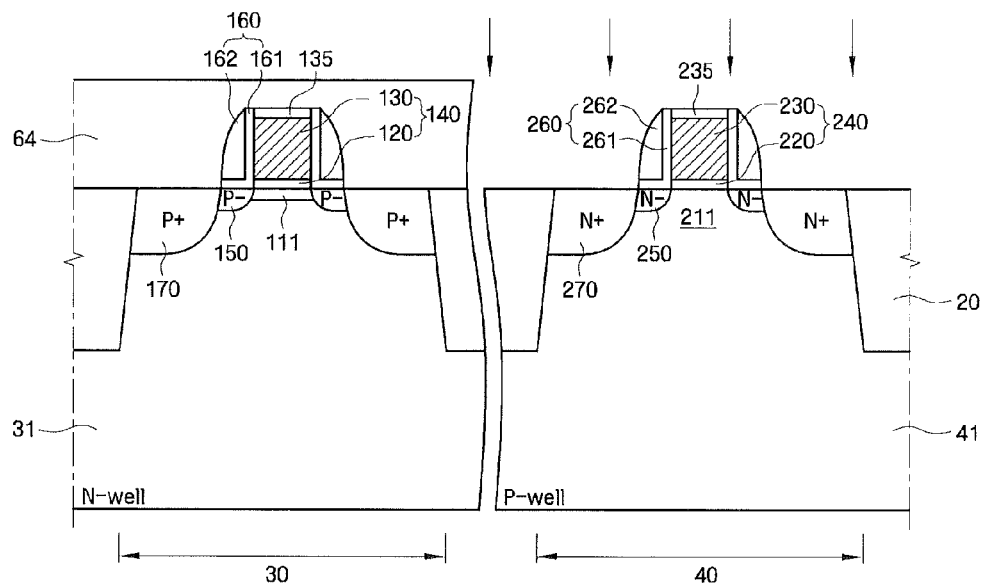

Next, referring to FIGS. 7A and 7B, P-type and N-type heavily doped impurity regions 170 and 270 are formed.

In detail, as shown in FIG. 7A, the second active region 40 is blocked using a mask 63, and P-type impurity, e.g., boron (B), is implanted using the first gate stack 140, the first capping layer 135 and the first spacer 160 of the PMOS transistor as an ion implantation mask to form a P-type heavily doped impurity region 170 in the first active region 30.

Thereafter, as shown in FIG. 7B, the first active region 30 is blocked using a mask 64, and N-type impurity, e.g., arsenic (As), is implanted using the second gate stack 240, the second capping layer 235 and the second spacer 260 of the NMOS transistor as an ion implantation mask to form an N-type heavily doped impurity region 270 in the second active region 40.

Figure 8:
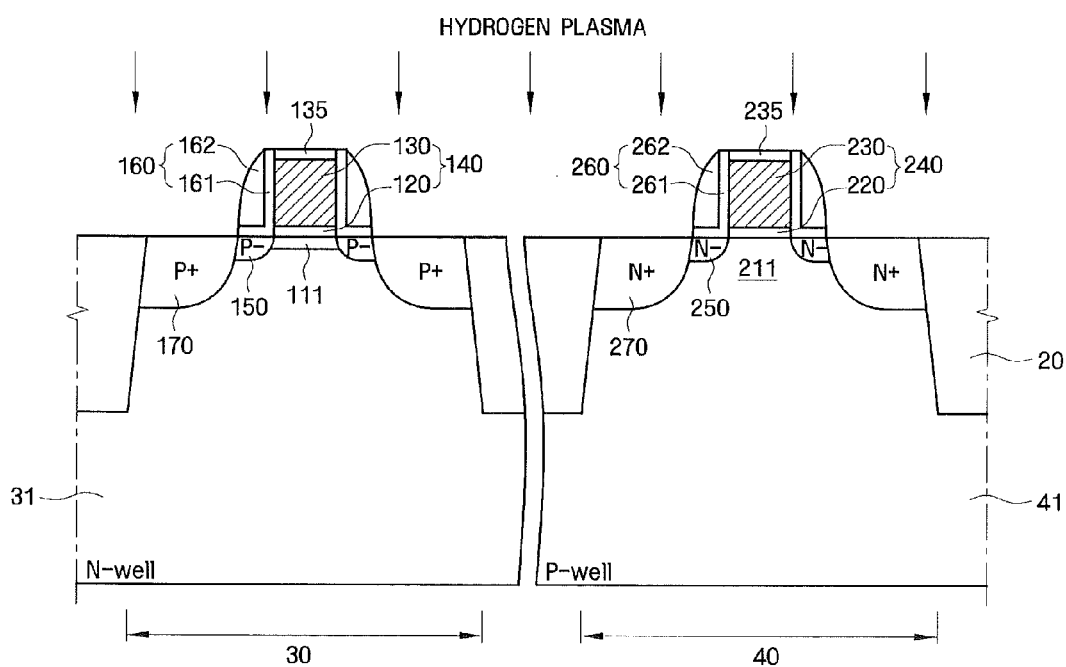

Next, referring to FIG. 8, the substrate 10 including the PMOS transistor 100 and the NMOS transistor 200 is treated with hydrogen plasma.

In detail, the mask 64 formed on the first active region 30 is removed and the substrate 10 is subjected to hydrogen plasma treatment. For example, the hydrogen plasma treatment may be performed under conditions of a hydrogen flow rate from about 50 to 10,000 sccm, RF (Radio Frequency) power may be applied under conditions of HF (High Frequency) power from about 50 to 500 W and LF (Low Frequency) power from about 10 to 100 W.

The RF power and the LF power may be simultaneously applied. In addition, the process temperature may range between about 200 and about 500° C.

Figure 9:
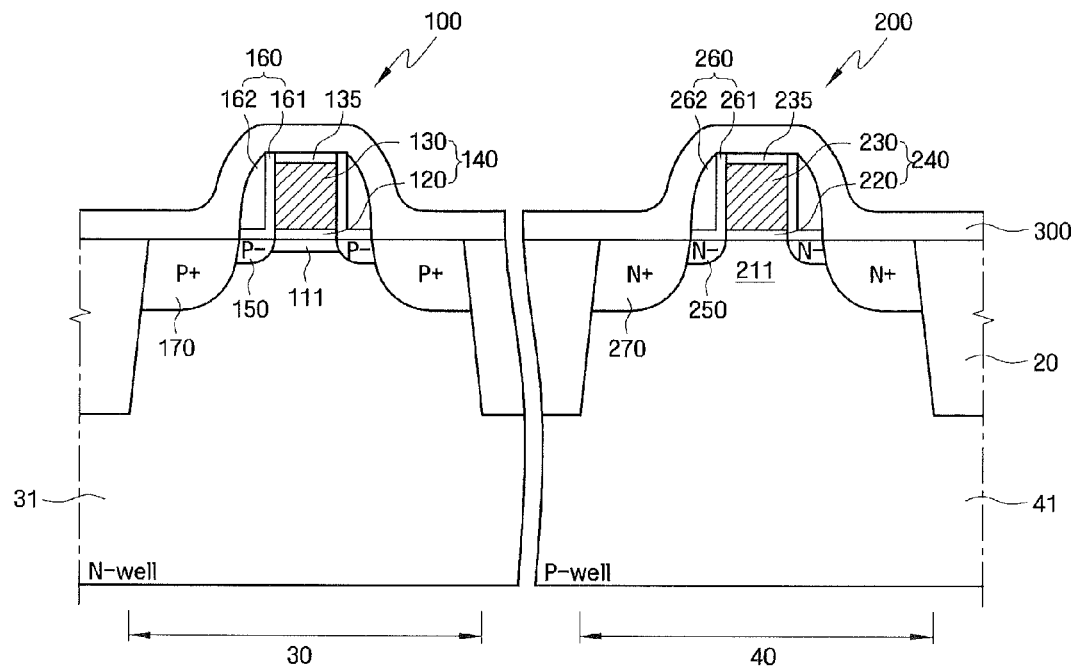

Referring to FIG. 9, a tensile stress film 300 is formed on the hydrogen plasma treated substrate 10.

In detail, the tensile stress film 300 may be a SiN film, a SiON film, a LPCVD (Low Pressure Chemical Vapor Deposition) oxide film, an ALD (Atomic Layer Deposition) oxide film, a SOG (Spin On Glass) film, and a laminated film formed by sequentially laminating two or more of these films. The tensile stress film 300 may be formed to a thickness of about 200 to 1,000 Å.

When the SiN film is deposited using a PECVD (Plasma Enhanced CVD) technique, $SiH_4$ gas is supplied at a rate in a range between about 10 and about 100 sccm, $NH_3$ gas is supplied at a rate in a range between about 10 and about 100 sccm, and $N_2$ gas is supplied at a rate in a range between about 1 and about 5 slm (standard liters per minute). The RF power supplied may be set to be in a range between about 50 watts and about 1000 watts, and the process temperature may be set to be in a range between about 400° C. and about 500° C. In particular, it is determined according to a ratio of N—H bonding to Si—H bonding in the SiN film whether the SiN film, i.e., the tensile stress film, has tensile stress or compressive stress. That is to say, if the ratio of N—H bonding to Si—H bonding is about 1 to 5, the SiN film has tensile stress, and if the ratio of N—H bonding to Si—H bonding is about 5 to 20, the SiN film has compressive stress. In this embodiment, therefore, the ratio of N—H bonding to Si—H bonding in the SiN film is adjusted to be about 1 to 5.

Meanwhile, the treating of the substrate 10 with hydrogen plasma may be performed in-situ with the forming the tensile stress film 300 on the substrate 10.

When the hydrogen plasma treated substrate 10 is exposed to the air, hydrogen readily moves in the air. Thus, after the treating of the substrate 10 with hydrogen plasma, the tensile stress film 300 is preferably in-situ formed to prevent the hydrogen implanted into the PMOS transistor 100 and the NMOS transistor 200 from moving in the air.

The tensile stress film 300 serves to improve operating characteristics of the NMOS transistor 200. In other words, when tensile stress is applied to the channel region 211, the effective mass in the channel region 211 may be decreased, which may increase the electron mobility, thereby improving the on-current characteristics of the NMOS transistor 200. Unlike the NMOS transistor 200, in order improve the operating characteristics of the PMOS transistor 100, compressive stress should be applied. In this case, the effective mass in the channel region 111 of the PMOS transistor 100 may be increased, which may increase the hole mobility, thereby improving the on-current characteristics of the PMOS transistor 100.

However, according to this embodiment, in order to simplify the fabrication process, as shown in FIG. 9, without using a separate mask for blocking the PMOS transistor 100, the tensile stress film 300 is formed on the entire surface of the surface of the substrate 10 having the PMOS transistor 100 and the NMOS transistor 200.

Here, as confirmed from the result shown in FIG. 13, compared to a case where a film without stress is formed (Comparative Example 1), the on-current values demonstrated a decrement of about 18%, in a case where the tensile stress film 300 is formed on the PMOS transistor 100 including the SiGe channel region 111 (Comparative Example 2), which is believed from the following considerations.

In general, when a gate insulating film is formed on a Si wafer substrate, oxygen ions are implanted into the Si wafer. Here, silicon oxide is created in the Si wafer, and the Si wafer is supplied with stress to be swollen. To address such a stress problem, silicon atoms absorbs energy from oxygen ions, so that they are pushed away from a lattice and migrate to then regrow on a surface of the substrate. However, since an implant concentration of oxygen ions is very high, silicon atoms may be prevented from migrating toward the lattice surface and may result in oversaturation of silicon atoms. As a result, silicon oxide may not be smoothly generated. Thus, the oxide film is generated at reduced speed and increased stress is applied to the substrate, thereby producing a concentrated silicon oxide. A direction in which the oxidation process is carried out may range from the inside of the substrate to the surface thereof at which the silicon atoms escaped from the lattice are supplied. It is often the case that unoxidized silicon atoms may remain at an interface between the insulating film and the silicon wafer. As described above, the unoxidized silicon atoms existing at the interface between the insulating film and the silicon wafer may form interface traps, which may suppress charge mobility. It is believed that an interface of a wafer made of different atoms, such as SiGe, has more interface traps than an interface of a silicon wafer made of a single atom, i.e., Si.

Therefore, according to the present invention, an interface between the SiGe channel region 111 and the first gate insulating film 120 has a higher trap density than an interface between a Si channel region and the gate insulating film. In addition, it is understood that tensile stress applied to the PMOS transistor having the higher interface trap density may further lower the on-current value of the PMOS transistor.

Accordingly, in this embodiment, before forming the tensile stress film 300, the substrate 10 having the PMOS transistor 100 and the NMOS transistor 200 is subjected to hydrogen plasma treatment, thereby reducing the density of interface traps at the interface between the SiGe channel region 111 and the first gate insulating film 120 of the PMOS transistor 100.

Referring to FIG. 13A, in a case of forming the tensile stress film 300 after the substrate 10 is subjected to the hydrogen plasma treatment, like in the present embodiment (Experimental Example), it can be understood that a decrement in the on-current value of the PMOS transistor 100 was reduced from about 18% to about 12%, while the on-current value of the NMOS transistor 200 is barely affected.

To sum up, in the method of fabricating the semiconductor device according to this embodiment, the PMOS transistor 100 can reduce its threshold voltage and enhance the mobility of charges using the SiGe channel region 111 and selectively adjusting the position of the substrate 10 to have a <100> crystallographic orientation. Meanwhile, the NMOS transistor 200 can enhance the mobility of electrons using the tensile stress film 300. Further, in order to simplify the fabrication process, the tensile stress film 300 may be formed on the PMOS transistor 100 as well. However, before forming the tensile stress film 300, the substrate 10 having the PMOS transistor 100 may be subjected to hydrogen plasma treatment, thereby remarkably reducing a decrement in the on-current value by use of the SiGe channel region 111 and by selectively adjusting the position of the substrate 10. Since a separate mask is not used, the fabrication process is simplified.

FIGS. 10 through 12 are cross-sectional views illustrating processing steps for a method of fabricating a semiconductor device according to a second embodiment of the present invention, in which like reference numerals denote the same or like elements in FIGS. 1 through 9, and thus detailed descriptions thereof will not be given below.

The method of fabricating the semiconductor device according to the second embodiment of the present invention is different from that according to the first embodiment of the present invention in that a liner film 310 with tensile stress is formed on PMOS and NMOS transistors 100 and 200, before performing hydrogen plasma treatment on a substrate 10 having the PMOS and NMOS transistors 100 and 200. The same steps as those performed until the PMOS and NMOS transistors 100 and 200 are formed in the first embodiment are performed, and only the steps following the performing of hydrogen plasma treatment will now be described.

Referring to FIG. 10, after the N-type and P-type heavily doped impurity regions 170 and 270 are formed, the liner film 310 with tensile stress is formed on the substrate 10. The liner film 310 with tensile stress may include, for example, a SiN film, a SiON film, an LPCVD (Low Pressure Chemical Vapor Deposition) oxide film, an ALD (Atomic Film Deposition) oxide film, an SOG (Spin On Glass) film and/or a laminated film formed by laminating two or more of these films. In an exemplary embodiment, the liner film 310 with tensile stress may be formed of a SiN film. In this case, the liner film 310 may be formed so as to have tensile stress by adjusting a ratio of N—H bonding to Si—H bonding to be in a range between about 1 and about 5.

The liner film 310 with tensile stress is first formed, followed by subjecting to hydrogen plasma treatment, thereby preventing hydrogen induced into the PMOS and NMOS transistors 100 and 200 from moving to the air. Here, the hydrogen plasma treatment may cause a drop in the tensile stress to the liner film 310 with tensile stress. Thus, the liner film 310 with tensile stress is preferably formed to have a thickness as small as possible so as to prevent hydrogen movement. That is to say, the liner film 310 with tensile stress may be formed to a thickness of greater than 0 and less than 100 Å.

Referring to FIG. 11, hydrogen plasma treatment is performed on the substrate 100 having the liner film 310 with tensile stress.

Referring to FIG. 12, a tensile stress film 300 is formed on the hydrogen plasma treated substrate 10.

Meanwhile, the forming of the forming the liner film 310 with tensile stress on the substrate 10, the performing of the hydrogen plasma treatment on the substrate 10, and the forming of the tensile stress film 300 may be in-situ performed.

In the method of fabricating the semiconductor device according to the second embodiment of the present invention, the liner film 310 with tensile stress is previously formed to have a small thickness, and hydrogen plasma treatment is then performed, thereby preventing hydrogen induced into the PMOS and NMOS transistors 100 and 200 from moving to the air.

A method of fabricating a semiconductor device according to a third embodiment of the present invention is different from the method of fabricating the semiconductor device according to the second embodiment in that before forming a liner film 310 with tensile stress, a substrate 10 having P-type and N-type heavily doped impurity regions 170 and 270 is further treated with hydrogen plasma. Accordingly, a concentration of hydrogen induced into the PMOS and NMOS transistors 100 and 200 can be efficiently increased.

The present invention will be described in detail through the following concrete experimental examples. Since those who are skilled in the art can sufficiently analogize the technical contents which are not described in the following concrete experimental examples, the detailed description thereabout is omitted.

EXPERIMENTAL EXAMPLE

A position of a Si substrate was adjusted such that a channel region may have a <100> crystallographic orientation. A recess was formed at a PMOS transistor portion and a SiGe epitaxial layer was then formed. Next, SiON and HfSiON were formed to thicknesses of 12 Å and 20 Å, respectively, to be used as a gate insulating film. Then, TiN and poly-Si were formed to thicknesses of 35 Å and 600 Å to be used as a gate electrode. The gate electrode was formed to have a length of 32 nm, which corresponds to a channel width. Subsequently, the substrate having a PMOS transistor including a SiGe channel region and an NMOS transistor including a Si channel region was treated with hydrogen plasma. The hydrogen plasma treatment was performed by setting a hydrogen flow rate to about 3000 sccm, an HF power to about 90 W, and an LF power to about 30 W. The process temperature was about 480□. Next, a SiN film with tensile stress as a tensile stress film is formed on the entire surface of the hydrogen plasma treated substrate 10 to a thickness of about 600 Å. The performing of the hydrogen plasma treatment and the forming of the tensile stress film were in-situ performed.

Comparative Example 1

Unlike in Experimental Example in which hydrogen plasma treatment was performed on the substrate, in this Example, a SiN film without stress was formed on the entire surface of a substrate having a PMOS transistor including a SiGe channel region and an NMOS transistor including a Si channel region to a thickness of 600 Å, and hydrogen plasma treatment was not performed on the substrate. The other process conditions were the same as those of Experimental Example.

Comparative Example 2

Unlike in Experimental Example in which hydrogen plasma treatment was performed on the substrate, in this Example, hydrogen plasma treatment was not performed on the substrate. The other process conditions were the same as those of Experimental Example.

FIGS. 13A and 13B graphically illustrate results obtained by measuring on-current values relative threshold voltage levels of PMOS and NMOS transistors of semiconductor devices fabricated in Example and Comparative Examples 1 and 2, in which the x-axis indicates threshold voltage levels, and the y-axis indicates on-current values.

Referring to FIG. 13A, in a case of a PMOS transistor including a SiGe channel region, when the threshold voltage is about −0.2 V, the on-current value of the PMOS transistor according to Experimental Example was about $4.9 \times 10^{-4}$ A/μm, the on-current value of the PMOS transistor according to Comparative Example 1 was about $5.6 \times 10^{-4}$ A/μm, and the on-current value of the PMOS transistor according to Comparative Example 2 was about $4.6 \times 10^{-4}$ A/μm. The PMOS transistor according to Comparative Example 2 demonstrated a decrement of about 18% in terms of the on-current value, compared to the PMOS transistor according to Comparative Example 1. Accordingly, it can be understood that when tensile stress is applied in a SiGe channel, the mobility of charges is reduced. Like in Experimental Example, however, when hydrogen plasma treatment was performed before forming the tensile stress film, the PMOS transistor according to Comparative Example 2 demonstrated an increase of about 6% in terms of the on-current value, compared to the PMOS transistor according to Experimental Example.

Referring to FIG. 13B, in a case of an NMOS transistor including a Si channel region, when the threshold voltage is about 0.32 V, the on-current value of the NMOS transistor according to Experimental Example was about $1.10 \times 10^{-3}$ A/μm, the on-current value of the NMOS transistor according to Comparative Example 1 was about $1.03 \times 10^{-3}$ A/μm, and the on-current value of the NMOS transistor according to Comparative Example 2 was about $1.10 \times 10^{-3}$ A/μm. The NMOS transistor according to Comparative Example 2 in which a tensile stress film is formed demonstrated an increase of about 6% in terms of the on-current value, compared to the NMOS transistor according to Comparative Example 1 in which a tensile stress film is not formed. Even when hydrogen plasma treatment was performed, like in Experimental Example, there was little change in the on-current value.

FIG. 14 graphically illustrates a result obtained by measuring off-current values relative to on-current values of PMOS and NMOS transistors of semiconductor devices fabricated in Example and Comparative Examples 1 and 2, in which the x-axis indicates on-current values, and the y-axis indicates off-current values.

Referring to FIG. 14, on the basis of the same off-current value of about $1 \times 10^{-7}$ the PMOS transistor according to Comparative Example 2 demonstrated the on-current value of about $4.8 \times 10^{-4}$ A/μm, which is a decrement of about 20% compared to the on-current value, i.e., about $6.0 \times 10^{-4}$ A/μm, of the PMOS transistor according to Comparative Example 1. Meanwhile, the PMOS transistor according to Experimental Example in which hydrogen plasma treatment was performed demonstrated, the on-current value of about $5.3 \times 10^{-4}$ A/μm, which is an increase of about 8% compared to the on-current value, i.e., about $6.0 \times 10^{-4}$ of the PMOS transistor according to Comparative Example 1.

Therefore, it can be understood that even when there is a tensile stress film on a PMOS transistor including a SiGe channel region, the tensile stress film formed for simplifying the fabrication process, a decrement in the on-current values of the PMOS transistor, which have enhanced by other parameters, can be remarkably reduced by treating the substrate with hydrogen plasma before forming the tensile stress film. In addition, since a separate mask is not used, the fabrication process is simplified while preventing the on-current values of the PMOS transistor from being reduced.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of forming an integrated circuit device, comprising:
    forming a PMOS transistor having a SiGe channel region therein, said forming a PMOS transistor comprising adjusting a position of a substrate such that a crystallographic orientation of the SiGe channel region formed in the substrate is parallel to a <100> crystallographic orientation of the substrate;
    exposing source and drain regions of the PMOS transistor to a hydrogen plasma; and
    forming a tensile stress layer on the PMOS transistor, which applies tensile stress to the SiGe channel region, after said exposing.

2. The method of claim 1, wherein said forming comprises forming a silicon nitride layer having a net tensile stress therein on the PMOS transistor.

3. The method of claim 1, wherein said exposing is preceded by depositing a tensile stress liner on the PMOS transistor; and wherein said exposing comprises exposing the tensile stress liner to the hydrogen plasma.

4. The method of claim 3, wherein the tensile stress liner is thinner than the tensile stress layer.

5. The method of claim 3, further comprising exposing at least a portion of the PMOS transistor to a hydrogen plasma before said depositing.

6. The method of claim 4, wherein the tensile stress liner is deposited to a thickness of greater than 0 Å and less than 100 Å.

7. The method of claim 1, wherein said exposing is performed in-situ with said forming the tensile stress layer on the PMOS transistor.

8. The method of claim 1, wherein forming a PMOS transistor comprises:
    selectively etching a surface of the substrate to define a recess therein; and
    epitaxially growing a silicon germanium region in the recess.

9. A method of forming an integrated circuit device, comprising:
    forming a plurality of MOS transistors adjacent a surface of a semiconductor substrate, said MOS transistors comprising PMOS transistors having SiGe channel regions and NMOS transistors having silicon channel regions, said SiGe channel regions having crystallographic orientations that are parallel to a <100> crystallographic orientation of the semiconductor substrate;
    exposing source and drain regions of the PMOS and NMOS transistors to a hydrogen plasma; and
    forming an electrically insulating tensile stress layer on the PMOS and NMOS transistors, which applies tensile stress to the SiGe channel regions and silicon channel regions, after said exposing.

10. The method of claim 9, wherein said forming comprises forming a silicon nitride layer having a net tensile stress therein on the MOS transistors.

11. The method of claim 9, wherein said exposing is preceded by depositing a tensile stress liner on the MOS transistors; and wherein said exposing comprises exposing the tensile stress liner to the hydrogen plasma.

12. The method of claim 11, wherein the tensile stress liner is thinner than the tensile stress layer.

13. The method of claim 11, further comprising exposing the PMOS and NMOS transistors to a hydrogen plasma before said depositing.

14. A method of forming an integrated circuit device, comprising:
    forming a PMOS transistor having a SiGe channel region therein,
    said forming a PMOS transistor comprising adjusting a position of a substrate such that a crystallographic orientation of the SiGe channel region formed in the substrate is parallel to a <100> crystallographic orientation of the substrate;
    exposing at least a portion of the PMOS transistor to a hydrogen plasma; and
    forming a silicon nitride layer having a net tensile stress on the PMOS transistor, which applies tensile stress to the SiGe channel region, wherein said forming the silicon nitride layer comprises performing a plasma enhanced chemical vapor deposition (PECVD) using $SiN_4$ gas supplied at a rate in a range of about 10 to about 100 sccm, $NH_3$ gas supplied at a rate in a range of about 10 to about 100 sccm, and $N_2$ gas supplied at a rate in a range of about 1 to about 5 slm (standard liters per minute) with a RF power setting in a range of about 50 watts to about 1000 watts at a process temperature in a range of about 400° C. to about 500° C.

15. The method of claim 14, wherein said exposing comprises exposing source and drain regions of the PMOS transistor to the hydrogen plasma.

16. The method of claim 15, wherein said forming the silicon nitride layer follows said exposing.

17. The method of claim 14, wherein said exposing is performed in-situ with said forming the silicon nitride layer.

* * * * *